(12) United States Patent
Buck et al.

(10) Patent No.: US 7,886,246 B2
(45) Date of Patent: Feb. 8, 2011

(54) METHODS FOR IDENTIFYING FAILING TIMING REQUIREMENTS IN A DIGITAL DESIGN

(75) Inventors: Nathan C. Buck, Underhill, VT (US);
John P. Dubuque, Jericho, VT (US);
Eric A. Foreman, Fairfax, VT (US);
Peter A. Habitz, Hinesburg, VT (US);
Chandramouli Visweswariah, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 12/103,845

(22) Filed: Apr. 16, 2008

(65) Prior Publication Data

US 2009/0265674 A1 Oct. 22, 2009

(51) Int. Cl.
*G06F 17/50* (2006.01)
*G06F 9/45* (2006.01)
(52) U.S. Cl. ............... 716/6; 716/4; 716/5; 716/18; 703/13; 703/14
(58) Field of Classification Search ........... 716/4–6, 716/18; 703/13–14
See application file for complete search history.

(56) References Cited

U.S. PATENT DOCUMENTS

| | | | |
|---|---|---|---|
| 7,174,523 B2 * | 2/2007 | Engel et al. ............. | 716/6 |
| 7,181,713 B2 | 2/2007 | Schultz | |
| 7,239,997 B2 * | 7/2007 | Yonezawa ............... | 703/19 |
| 7,293,248 B2 | 11/2007 | Chang et al. | |
| 7,401,307 B2 * | 7/2008 | Foreman et al. ........ | 716/6 |
| 7,555,740 B2 * | 6/2009 | Buck et al. ............. | 716/12 |
| 7,716,616 B2 * | 5/2010 | Foreman et al. ........ | 716/6 |
| 2003/0037306 A1 | 2/2003 | Gutwin et al. | |
| 2007/0220345 A1 | 9/2007 | Hathaway et al. | |
| 2007/0234256 A1 | 10/2007 | Chang et al. | |

* cited by examiner

*Primary Examiner*—Nghia M Doan
(74) *Attorney, Agent, or Firm*—Wood, Herron & Evans, LLP

(57) ABSTRACT

Methods for identifying failing timing requirements in a digital design. The method includes identifying at least one timing test in the digital design that has a passing slack in a base process corner and a failing slack in a different process corner. The method further includes computing a sensitivity of the failing slack to each of a plurality of variables and comparing each sensitivity to a respective sensitivity threshold. If the sensitivity of at least one of the variables is greater than the respective sensitivity threshold, then the at least one timing test is considered to fail.

10 Claims, 1 Drawing Sheet

METHODS FOR IDENTIFYING FAILING TIMING REQUIREMENTS IN A DIGITAL DESIGN

FIELD OF THE INVENTION

The invention relates generally to integrated circuit design and, in particular, to static timing analysis for analyzing the timing characteristics of an integrated circuit design.

BACKGROUND OF THE INVENTION

Static timing analysis (STA) is used to analyze, debug, and validate the time performance of a chip during the design phase and in advance of actual fabrication. The timing of the chip is simulated to determine if it meets the timing constraints to achieve timing closure and, therefore, is likely to operate properly if fabricated in accordance with the tested design.

Deterministic STA (DSTA) propagates timing quantities, such as arrival times, required arrival times, and slews, along with any other timing related quantities (guard times, adjusts, asserts, etc.), as single valued deterministic data. Each individual timing run covers a single corner in a space of process variations. A corner is a set of input values for variables that may include temperature of the circuit, input voltage, and various manufacturing variables of an integrated circuit. In order to evaluate the impact that a given variable will have on timing, multiple DSTA timing runs must be executed with variables that affect timing set at several maximum and minimum corners, such as high and low temperature, high and low voltages, and various processing conditions. For example, DSTA timing runs may compare a corner characterized by a combination of high input voltage, a high operating temperature, and the worst manufacturing variables with a corner characterized by a combination of a low input voltage, a low operating temperature, and the best manufacturing variables. As a check of the performance of the integrated circuit design, many or all of the corners may be run and the integrated circuit design adjusted until all of the corners pass the timing tests.

To maintain timing closure, DSTA limits the actual delay for any path by ensuring that the actual delay is always faster than a slow test limit and always slower than a fast test limit. The difference between the actual delay and these test limits is called a timing margin. Minimization of the timing margin provides higher performance and lower power for the same technology. However, the timing margin includes many diverse sources of delay variation.

In DSTA, the cell and wire delay components of each path are treated independently from all other paths. The worst case is found and included in the timing margin. In addition, the modeling of a cell and wire delay along any arbitrary path contains errors in the form of inaccuracies and simplifications. For DSTA, the extremes of these errors are used when applying delays and calculating delays. As a result, this further increases the required margin, which is contrary to the desired trend toward minimization. The environment conditions that the chip can experience in the final end-use application, such as the largest and smallest voltage, the highest and lowest temperature, an estimate of the maximum lifetime, etc., have an increase by the maximum possible uncertainty in the estimation, and the delay model sensitivity to these effects is also included in the margin setting. Manufacturing process variations lead to device and interconnect variations with a multitude of different variable variations, like device channel length, gate capacitance, and interconnect wire capacitance and resistance, which all impact the delay of a path on the chip. For each of these variables, a pessimistic maximum and minimum range of variation is assumed and is added into the timing margin. As a result, the combination of these sources of delay estimation sets an overly pessimistic timing picture.

When investigated, the main reason for a timing fail is exposed in the sensitivity of the timing test to the source of variation, whether source of variation is a state dependent effect, an environment variable, or a process variation. Sensitivities are calculated in a block-based statistical static timing analysis (SSTA) approach at every timing path, cell, and interconnect, and are accumulated along a path and exposed at the final timing test. The relative size of these sensitivities indicates which of these variations is most critical, and can be the main contributor or cause of hardware that is unlikely to operate properly.

A single large sensitivity indicates a serious problem that needs to be corrected in the design. Evenly distributed small sensitivities reflect design robustness towards variations, so the accumulated pessimism is too large. This effect is included in SSTA when seeking for a worst case of a joint probability distribution of all statistical variables. However, not all origins of the timing margins can be part of timing calculations in SSTA. For example, the state dependent effects are application specific and, as a result, do not have a distribution from chip to chip. Modeling inaccuracy and simplification may be consistent for all cells and every chip has to work on all environment conditions. So, a large margin is left beyond the capabilities of SSTA.

Further, to apply SSTA, the process must be modeled in a statistical fashion. For every process variable, a distribution must be specified and verified with hardware manufactured under the same conditions the new chip may experience. This is an extremely difficult task, and imposes expensive restrictions on the manufacturing process that may limit process changes.

DSTA only predicts a single corner of the space of process variations with each timing run. Consequently, in order to achieve timing closure and assuming N variables (i.e., sources of variation) and two corners per variable, up to $2^N$ corners may have to be analyzed by individual DSTA timing runs. Unfortunately, this may lead to an excessive and impractical number of timing runs to analyze, debug, and validate a chip design.

Accordingly, there is a need for an improved method during DSTA that overcomes these and other deficiencies of conventional DSTA.

SUMMARY OF THE INVENTION

In an embodiment of the invention, a method is provided for identifying failing timing requirements in a digital design. The method includes identifying at least one timing test in the digital design that has a passing slack in a base process corner and a failing slack in a different process corner. The method further includes computing a sensitivity of the failing slack to each of a plurality of variables and comparing each sensitivity to a respective sensitivity threshold. If the sensitivity of at least one of the variables is greater than the respective sensitivity threshold, then the at least one timing test is considered to fail.

DETAILED DESCRIPTION

Figure 1:
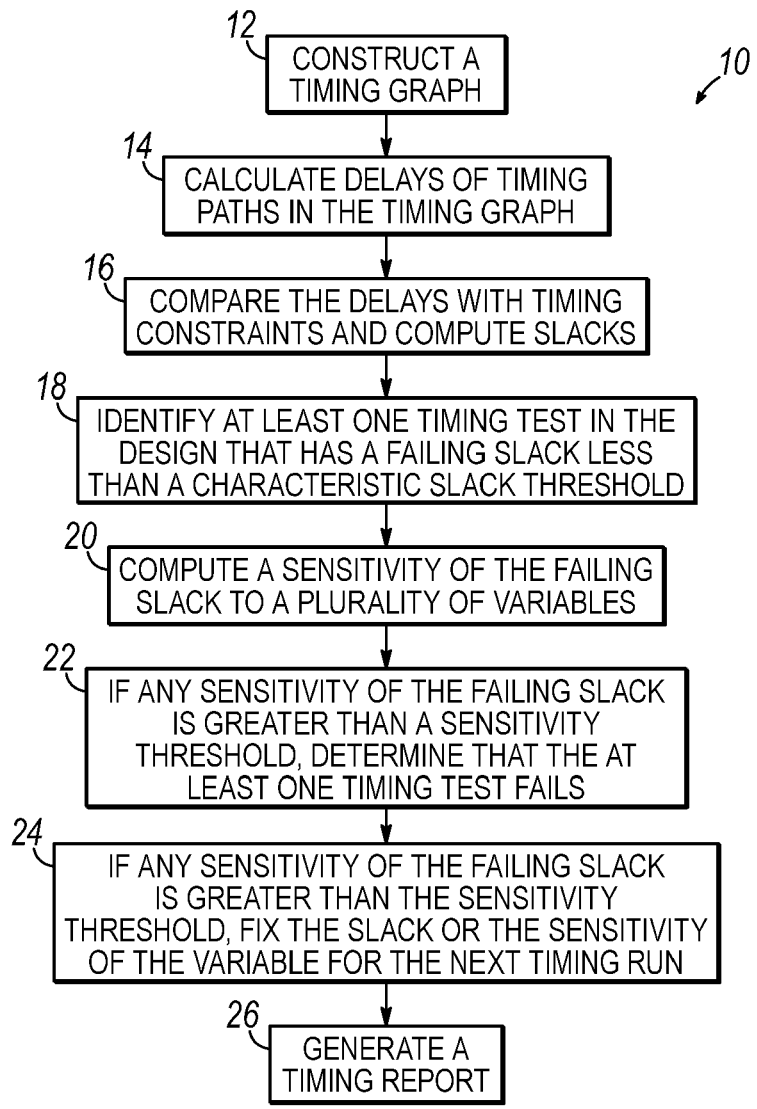
FIG. 1 is a flow chart of a method of conducting static timing analysis of a chip in accordance with an embodiment of the invention.

With reference to FIG. 1, a process flow 10 for a multi-corner static timing analysis (STA) tool is shown. In block 12, the STA tool identifies timing paths within a digital design by constructing a timing graph from a netlist representing the structure of the chip to be analyzed. The STA tool is also provided with a set of timing assertions, a set of delays for the different sources of variation in the space of process variations, and sensitivities relating the delay attributable to each individual source of variation. The timing graph contains nodes at which signal transitions occur and edges connecting various incident nodes. The timing graph represents a design description consisting of nodes and edges representing delays in the circuit incurred when a logical transition (either from low to high or from high to low) is transmitted through a circuit component, such as a gate or wire. A typical STA tool analyzes a synchronous design description for timing violations by breaking down the design into individual timing paths in the timing graph. Each timing path has an origin (i.e., a place in a design description where data is launched by a reference signal edge) and an endpoint (i.e., a place in the design description where data is captured by a reference signal edge).

Figure 2:
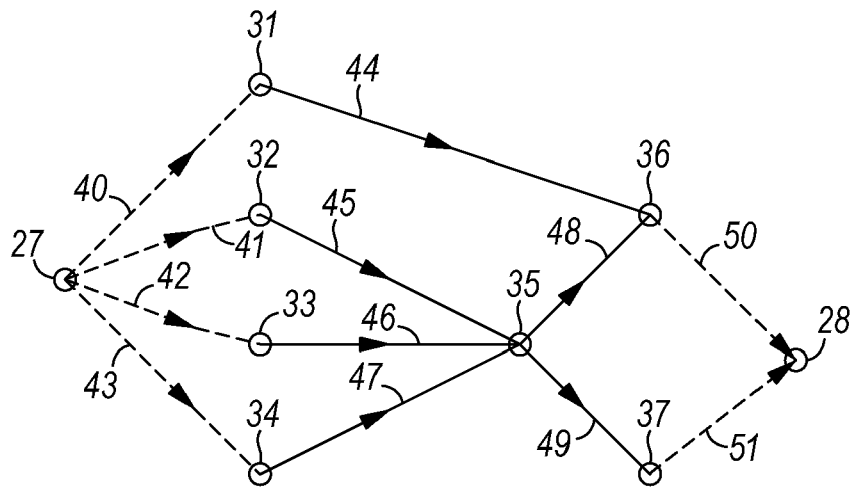
FIG. 2 shows a representative timing graph generated by a timing run in static timing analysis.

With reference to FIG. 2, a timing graph is shown that includes an origin 27, an endpoint 28, a plurality of nodes 31-37 connected between the origin 27 and endpoint 28, and edges 40-51. The origin 27 may be a primary input port of the chip and the endpoint 28 may be a primary output port of the chip or a node that controls data propagation (e.g., the input to storage elements, such as latches). Different timing paths are grouped in path groups according to the clocks controlling their endpoints. The nodes 31-37 represent points at which signal transitions can occur and the edges connect incident nodes.

In block 14, the STA tool calculates signal propagation delays for each timing path in the timing graph. The signal propagation delays (ATs and RATs) computed by the STA tool are normally made with respect to some specific time within a repeating clock cycle. The STA tool computes early mode and late mode ATs at each node by forward propagating signals from the origin to the endpoint. ATs are typically stored on the nodes of the timing graph and delays of individual gates and wires are typically stored on the edges of the timing graph. Signals are propagated through edges by adding edge delays to signal ATs. When multiple ATs are propagated along different edges to each of the nodes, the AT at the node is computed as the maximum (for late mode ATs) or the minimum (for early mode ATs) of the incoming edge delays. A late mode AT is the earliest time at which the corresponding signal is guaranteed to be stable at its correct logical value after the signal has traversed any of the possible paths of the integrated circuit. An early mode AT is the earliest time at which the corresponding signal can change from its stable logical value during the previous clock cycle. The output of a node cannot change earlier than the early mode AT.

The STA tool backward propagates RATs through the timing graph. The RATs define the times at which the signal is required to get to an endpoint in order to meet the timing requirements. When multiple RATs are propagated along different edges to a node, the RAT at the node is computed as the maximum (for early mode RATs) or the minimum (for late mode RATs) of the RATs of the incoming edges. A late mode RAT indicates the latest time within the clock period of a given clock phase that a signal transition may occur at the node without violating a timing constraint. An early mode RAT indicates the earliest time within the clock period of a given clock phase that a signal transition may occur at the node without violating a timing constraint.

In block 16, the STA tool compares the signal propagation delay for each timing path against the path timing constraints specified in the design. The timing constraints include items such as setup and hold constraints at latch inputs, as well as pulse width tests, loop cut tests, clock gating tests, etc. Setup timing constraints enforce a maximum delay on a timing path relative to the reference signal path. Hold timing constraints enforce a minimum delay on a timing path relative to the reference signal path.

For the endpoints in each timing path, the STA tool determines a difference between the ATs and RATs to compute timing metrics in the form of slacks at each of the nodes (RAT minus AT for late mode and AT minus RAT for early mode), which are defined thus so that a negative slack value will always indicate a violation of a timing constraint. Hence, a negative slack value for either a late mode slack or an early mode slack indicates a timing constraint violation. A positive slack indicates an amount of time by which a violation of a timing constraint is avoided by a path delay. The STA tool also calculates a numerically weighted sensitivity for each a source of variation, which are used when determining the worst slack due to variation. Pessimism (i.e., requiring a signal to become stable earlier or remain stable later than would be required by the simulation of any possible input pattern) is included within the slack calculation.

In block 18, at least one timing test is identified in the design that has a passing slack in a based corner and a failing slack in a different corner. Specifically, the STA tool identifies timing tests that have passed an initial screen in which the timing test passes for a base corner and, for each of these timing tests, the STA tool determines whether or not the slack of the timing test evaluated at a different corner is less than a characteristic slack threshold. If any particular slack at the different corner is less than the characteristic slack threshold, then a failed timing test is identified. In one embodiment, the failing slack is considered to be less than the characteristic slack threshold if the failing slack is negative.

In one embodiment, the failing slack may be computed via slack extrapolation. One approach for computing the extrapolated failing slack is to subtract a multiple of a standard deviation of each sensitivity from a mean slack. Another approach for computing the extrapolated failing slack is to subtract a multiple of the standard deviation of the sensitivity of a first group of the variables from a mean slack and to subtract a multiple of the sensitivity of a second group of the variables from the mean slack. Yet another approach for computing the extrapolated failing slack is to subtract a multiple of each sensitivity from a mean slack.

In block 20, the STA tool computes a sensitivity of the failing slack to each of a plurality of variables or sources of variation. The variables may be process, environment, or state dependent parameters. The STA tool then determines whether the sensitivity of the failing slack to each variable is greater than a respective sensitivity threshold. In block 22, if any variable sensitivity of the failing slack is greater than its respective sensitivity threshold, then the at least one timing test is considered to fail. Otherwise, if none of the variable sensitivities is greater than its respective threshold, then the failing slack is classified to be passing. In block 24, if any sensitivity of the failing slack exceeds its sensitivity threshold, the slack or the sensitivity of the variable is fixed in advance of the next timing run. In this manner, timing tests over-pessimistically marked as failing are effectively removed from the failing list in the timing report.

Any slack sensitivities that contribute to excess margin can be isolated from all sources of variation. When using these specific slack sensitivities, the slack can be increased with a specific credit. By doing this, certain failing slacks may not need to be fixed in the digital design. Allowing a negative slack for specific timing tests reduces the timing margin, which is beneficial because pessimism can be reduced without introducing statistical timing closure.

In block 26, a timing report is generated. Information generated in the timing report may be used to constrain timing paths during circuit synthesis to reduce timing constraint violations. The timing report typically includes arrival times, required arrival times, and slacks at each node of the chip. Various automatic audits, such as checking for excessive variable sensitivities, may be built into the timing report. Excessive variable sensitivities typically must be reduced in order to improve the robustness of the circuit. The timing report may also include the timing tests, which are characterized by a failing slack but have sensitivities of the failing slack to each source of variation that are less than the respective sensitivity thresholds, that are categorized as passing and, therefore, removed from the failing list.

In an alternative embodiment, the failing slack, which is calculated using the multi-corner STA tool, is projected by extrapolation to different process corners and used to identify timing tests in the design that have both a failing slack and a passing slack. One such representative corner may be the worst corner of all the variables or sources of variation combined to make the slack the most negative.

At least one timing test is identified that has both a failing slack and a passing slack. Slack timing constraint violations are initially screened or filtered using the worst slack to identify those timing tests with failing slacks that fail to meet chip performance requirements. This group of failing projected slacks is then screened again with regard to the sensitivity of the failing projected slack to each variable. If the computed sensitivity for any of the variables is greater than a unique sensitivity threshold for the variable, then the projected slack remains identified as failing. If the computed sensitivity for all variables is less than the respective sensitivity thresholds, then the projected slack is identified as passing and the next variable is considered.

These failing slacks are subjected to one or more optional screens for further filtering of failing projected slacks that are insignificant contributors to design variability. Specifically, any identified failing slacks with at least one variable sensitivity exceeding its sensitivity threshold are then analyzed to identify failing projected slacks for variables that are flipped. If the variable is not flipped, then the failing projected slack with at least one variable sensitivity exceeding its sensitivity threshold is considered passing. If the source of variation is flipped, then the failing slack with at least one variable sensitivity exceeding its sensitivity threshold is categorized for fixup before the next timing run.

The identified failing slacks with a variable sensitivity exceeding its sensitivity threshold and that are flipped are then analyzed to identify failing projected slacks having a specific combination of variables or variable groups with sensitivities greater than their respective sensitivity thresholds. If so, then the failing projected slack with at least one variable sensitivity exceeding its sensitivity threshold is categorized for fixup before the next timing run. If not, the projected slack is identified as passing and the next variable is considered relative to its variable sensitivity.

After the series of screens, all remaining failing projected slacks are fixed as they are identified as significant contributors to design variability. However, because certain failing slacks are eliminated by the procedure, the end result of the procedure is a reduced set of timing tests with violations that are added to the fixup list, which reduces design fixup/timing closure TAT.

Other projections, such as a mixed approach (RSSing some variables, full three-sigma of other variables, etc.) are possible. RSSing is an operation taking the square root of the sum of the squares of two quantities, in place of straight summation, resulting in a significantly reduced final product as compared to summation.

In an alternative embodiment of the invention, the failing slack may be determine using a statistical static timing analysis (SSTA) tool, instead of the multi-corner STA tool, that propagates timing quantities as probabilistic statistical distributions instead of as single valued deterministic data. In block-based SSTA, statistical minimum and maximum operations used to calculate slacks for the propagated statistical distributions. As the input data to these operations are functions (statistical distributions), the output of a statistical minimum or maximum operation is also a function. These propagated distributions will typically overlap such that each one will produce a minimum (or maximum) some percentage of the time over numerous samples. Therefore, the output function is defined as a linear combination of all of the inputs, with each input weighted by the probability that it will produce either the minimum or the maximum result.

Applicants hereby incorporate by reference herein the entire disclosure of U.S. Publication No. 2005/0065765, published Mar. 24, 2005 from Ser. No. 10/666,353 filed Sep. 19, 2003 and entitled "System and Method for Statistical Timing Analysis of Digital Circuits", for additional description of the SSTA process.

Given this disclosure it is apparent to one skilled in the art that the inputs received by the probabilistic or statistical static timing process can be any input generally known to computer systems, including but not limited to: keyboard or mouse entries, disk, tape, CD-ROM, network connection, fiber optic connection, radio frequency link, infra red link, etc. Further the outputs including the parameterized timing report can take the form of any known computer output. These outputs include but are not limited to: printed output from a printer, images on a graphical user interface (GUI) or CRT, content on storage media (e.g., memory, CD-ROM, disk, diskette), files, information transmitted over a network (fiber optic, telephone, cable, radio frequency, infrared, etc.).

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of identifying failing timing requirements in a digital design, the method comprising:

identifying, with a computer, at least one timing test in the digital design that has a passing slack in a base process corner and a failing slack in a different process corner, wherein the failing slack is computed via slack extrapolation by subtracting a multiple of the standard deviation of the sensitivity of the extrapolated failing slack to a first group of the variables from a mean slack and subtracting a multiple of the sensitivity of the extrapolated failing slack to a second group of the variables from the mean slack;

computing a sensitivity of the failing slack to each of a plurality of variables of the at least one timing test;

comparing each sensitivity to a respective sensitivity threshold; and if the sensitivity of at least one of the variables is greater than the respective sensitivity threshold and the projected failing slack is reduced due to the at least one of the variables moving to the opposite corner, determining with the computer that the at least one timing test fails if the at least one of the variables is not part of a variable group.

2. The method of claim 1 further comprising:
using the at least one timing test for timing closure during timing optimization.

3. The method of claim 1 further comprising:
computing the failing slack via multi-corner timing analysis.

4. The method of claim 1 further comprising:
computing the failing slack via statistical static timing analysis.

5. The method of claim 1 further comprising:
if the at least one sensitivity of the failing slack is greater than the respective sensitivity threshold, fixing the failing slack or the at least one sensitivity in advance of a subsequent timing run.

6. A method of identifying failing timing requirements in a digital design, the method comprising:
identifying, with a computer, at least one timing test in the digital design that has a passing slack in a base process corner and a failing slack in a different process corner, wherein the failing slack is computed via slack extrapolation by subtracting a multiple of the standard deviation of the sensitivity of the extrapolated failing slack to a first group of the variables from a mean slack and subtracting a multiple of the sensitivity of the extrapolated failing slack to a second group of the variables from the mean slack;

computing a sensitivity of the failing slack to each of a plurality of variables of the at least one timing test;

comparing each sensitivity to a respective sensitivity threshold;

if at least one sensitivity of the projected failing slack is greater than the respective sensitivity threshold, determining with the computer that the at least one timing test fails unless at least one of the variables is not flipped and the at least one of the variables is not part of a variable group.

7. The method of claim 6 further comprising:
using the at least one timing test for timing closure during timing optimization.

8. The method of claim 6 further comprising:
computing the failing slack via multi-corner timing analysis.

9. The method of claim 6 further comprising:
computing the failing slack via statistical static timing analysis.

10. The method of claim 6 further comprising:
if the at least one sensitivity of the failing slack is greater than the respective sensitivity threshold, fixing the failing slack or the at least one sensitivity in advance of a subsequent timing run.

* * * * *